US009300221B2

(12) United States Patent
Asako

(10) Patent No.: US 9,300,221 B2
(45) Date of Patent: Mar. 29, 2016

(54) POWER CONVERTER INCLUDING SMOOTHING CAPACITOR AND DISCHARGE RESISTOR

(71) Applicant: DENSO CORPORATION, Kariya, Aichi-pref. (JP)

(72) Inventor: Yousuke Asako, Anjo (JP)

(73) Assignee: DENSO CORPORATION, Kariya (JP)

( * ) Notice: Subject to any disclaimer, the term of this patent is extended or adjusted under 35 U.S.C. 154(b) by 24 days.

(21) Appl. No.: 14/307,872

(22) Filed: Jun. 18, 2014

(65) Prior Publication Data

US 2014/0369099 A1    Dec. 18, 2014

(30) Foreign Application Priority Data

Jun. 18, 2013    (JP) .................................. 2013-127390

(51) Int. Cl.
| H02M 7/00 | (2006.01) |
| H02M 7/797 | (2006.01) |
| H05K 7/20 | (2006.01) |
| H02M 1/32 | (2007.01) |

(52) U.S. Cl.
CPC .............. *H02M 7/003* (2013.01); *H02M 7/797* (2013.01); *H05K 7/20927* (2013.01); *H02M 2001/327* (2013.01)

(58) Field of Classification Search
CPC   H02M 7/003; H02M 7/797; H02M 2001/327
See application file for complete search history.

(56) References Cited

U.S. PATENT DOCUMENTS

| 2005/0237773 A1* | 10/2005 | Sasaki ................... H02M 7/003 363/146 |
| 2012/0032503 A1* | 2/2012 | Itou ........................ B60L 3/0084 307/9.1 |
| 2013/0039108 A1* | 2/2013 | Watanabe ............... H02M 7/48 363/131 |
| 2013/0070502 A1* | 3/2013 | Suzuki .................. H02M 7/003 363/131 |

FOREIGN PATENT DOCUMENTS

| JP | 11-235043 | 8/1999 |
| JP | 2010-124523 | 6/2010 |
| JP | 2012-039715 | 2/2012 |
| JP | 2013-066316 | 4/2013 |

\* cited by examiner

*Primary Examiner* — Jue Zhang
*Assistant Examiner* — Lakaisha Jackson
(74) *Attorney, Agent, or Firm* — Nixon & Vanderhye PC

(57) ABSTRACT

A power converter includes a body including a switching element; a plurality of semiconductor modules each having a control terminal projected from the body; a circuit board controlling the switching element; a cooler that cools the semiconductor modules; a smoothing capacitor smoothing direct-current voltage applied to the switching element; a discharge resistor disposed on a surface of the circuit board and electrically connected parallel to the smoothing capacitor. The semiconductor modules are mounted on the circuit board with the control terminal, the discharge resistor includes a first connecting portion at one end of the discharge resistor in a longitudinal direction thereof and a second connecting portion at an other end of the discharge resistor in the longitudinal direction, and the first connecting portion is connected to the control terminal via a wiring pattern provided on the surface of the circuit board.

5 Claims, 6 Drawing Sheets

POWER CONVERTER INCLUDING SMOOTHING CAPACITOR AND DISCHARGE RESISTOR

CROSS-REFERENCE TO RELATED APPLICATION

This application is based on and claims the benefit of priority from earlier Japanese Patent Application No. 2013-127390 filed Jun. 18, 2013, the description of which is incorporated herein by reference.

BACKGROUND

1. Technical Field

The present disclosure relates to a power converter that includes a smoothing capacitor and a discharge resistor parallelly connected to the smoothing capacitor.

2. Related Art

As disclosed in a patent document JP-A-2012-039715, for example, a power converter (three-phase inverter) of a well-known type includes a smoothing capacitor and a discharge resistor for discharging electric charges accumulated in the smoothing capacitor. The smoothing capacitor has a function of smoothing the direct-current voltage applied by a direct-current power source to the switching elements that configure the power converter.

The electric charge accumulated in the smoothing capacitor can be discharged by electrically disconnecting the smoothing capacitor from the direct-current power source to form a closed circuit including the smoothing capacitor and the discharge resistor. In this case, the discharge resistor generates heat with the discharging of the electric charges. If the discharge resistor that generates heat is not appropriately cooled, the reliability of the power converter is likely to be impaired.

SUMMARY

It is thus desired to provide a power converter which is able to appropriately cool a discharge resistor that generates heat with the discharging of the electric charge accumulated in a smoothing capacitor.

As a first aspect of the disclosure, an embodiment provides a power converter that converts a direct-current voltage received by the power converter to an alternating-current voltage. The power converter includes: a body including a switching element; a plurality of semiconductor modules each having a control terminal projected from the body; a circuit board that controls the switching element to be ON and OFF; a cooler that cools the semiconductor modules; a smoothing capacitor that smooth direct-current voltage applied to the switching element; a discharge resistor disposed on a surface of the circuit board and electrically connected parallel to the smoothing capacitor. The semiconductor modules are mounted on the circuit board with the control terminal, the discharge resistor includes a first connecting portion at one end of the discharge resistor in a longitudinal direction thereof and a second connecting portion at an other end of the discharge resistor in the longitudinal direction thereof, and the first connecting portion is connected to the control terminal via a wiring pattern provided on the surface of the circuit board.

The control terminal is a component of each of the semiconductor modules that are cooled by the cooler. Therefore, the temperature of the control terminal is lower than that of the discharge resistor. Accordingly, according to the disclosure in which the first connecting portion of the discharge resistor is connected to the control terminal via the wiring pattern, a greater part of the heat generated by the discharge resistor can be directed toward the control terminal via the wiring pattern. Thus, the discharge resistor is appropriately cooled and, further, the reliability of the power converter is favorably prevented from being impaired.

As a second aspect of the present disclosure, the discharge resistor is provided with a series-connected unit in which a plurality of parallel-connected resister elements are connected in series and the power converter is configured so that at least a part of the discharge resistor overlaps the cooler when viewing from the surface of circuit board.

With the above disclosure, the power converter is configured so that at least a part of the discharge resistor overlaps the cooler. Therefore, the distance between the discharge resistor and the cooler is reduced to thereby greatly enhance the effect of cooling the discharge resistor. Based on this configuration and from the viewpoint of the heat radiation performance of the discharge resistor and the fail-safe performance of the discharge resistor in the occurrence of an open failure, the above disclosure employs the discharge resistor having the configuration mentioned above. The discharge resistor includes resistor elements that are connected parallel to each other. Accordingly, the area occupied by the discharge resistor on the surface of the circuit board is large in respect of the direction in which the parallelly connected resistor elements are juxtaposed. This large area can contribute to increasing the area in which the discharge resistor overlaps the cooler, in a plan view of the surface of the circuit board. Thus, the effect of cooling the discharge resistor can be more enhanced.

As a third aspect of the present disclosure, the switching element is provided with a series-connected element including an upper arm switching element and a lower arm switching element. The circuit board controls the upper arm switching element and the lower arm switching element to be ON and OFF so as to convert the direct-current voltage to the alternating-current voltage. The smoothing capacitor is connected in parallel to the series-connected element and the second connecting portion is connected to one end of the smoothing capacitor via a connector provided on the circuit board and an electrically conductive connection member. The control terminal includes a detection terminal that is short-circuited to one of both ends of the series-connected element, in which the one of the both ends of the series-connected element is an end to which the second connecting portion is not connected. The first connecting portion is connected to one of both ends of the smoothing capacitor via the wiring pattern and the detection terminal, in which the one of the both ends of the smoothing capacitor is an end to which the second connecting portion is not connected.

Since the potential difference between the ends of the smoothing capacitor is large when discharging, the potential difference between the ends of the discharge resistor is also large. As a measure against this, connection between the discharge resistor and the smoothing capacitor may be based on a configuration in which the first and second connecting portions of the discharge resistor are individually connected to the smoothing capacitor via a connector and an electrically conductive connection member. In this case, the potential difference between the first and second connecting portions will be increased. Therefore, in the connector, it is necessary to increase an insulating distance between a part connected to the first connecting portion and a part connected to the second connecting portion. In this case, there is a concern that the size of the connector is increased.

In this regard, with the above disclosure, the first connecting portion of the discharge resistor is connected to the smoothing capacitor in accord with the aspect set forth above. Thus, in the discharge resistor, the second connecting portion alone is connected to the smoothing capacitor via the connector and the electrically conductive connection member. According to this configuration, the insulation distance is no longer required to be secured in the connector. Thus, the size of the connector is favorably prevented from becoming large.

DETAILED DESCRIPTION OF THE PREFERRED EMBODIMENTS

With reference to the accompanying drawings, hereinafter is described an embodiment in which a power converter of the present disclosure is exemplified in the form of a three-phase inverter.

Figure 1:
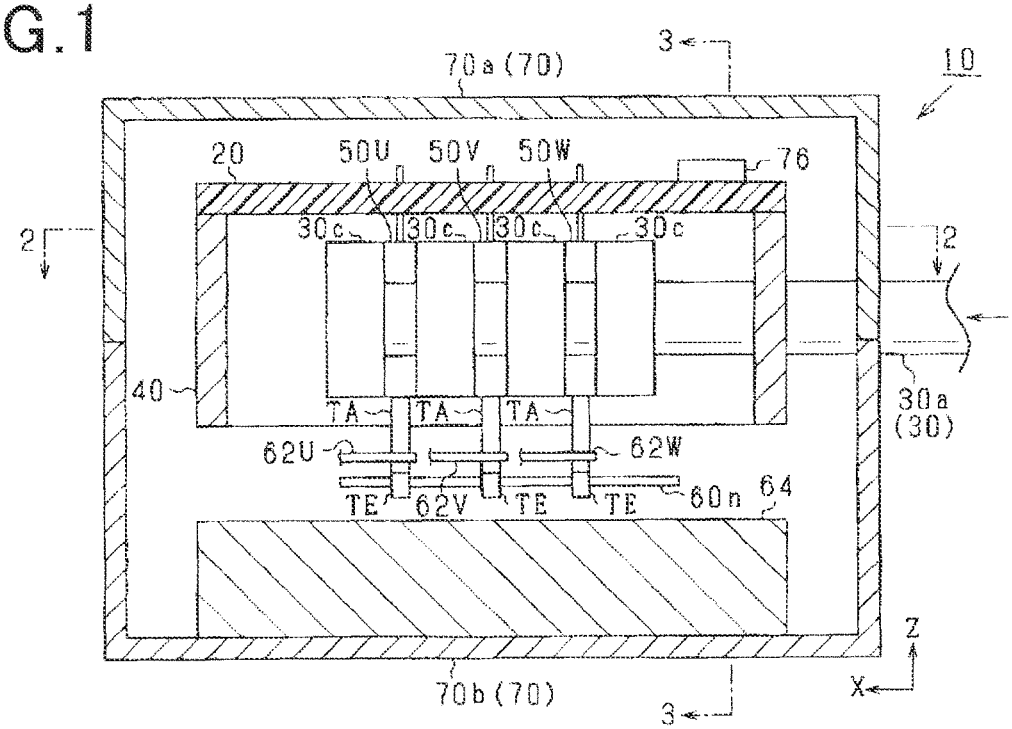
FIG. 1 is a cross-sectional view illustrating a three-phase inverter according to an embodiment of the present disclosure, the cross-sectional view being taken along a line 1-1 of FIG. 2.
Figure 2:
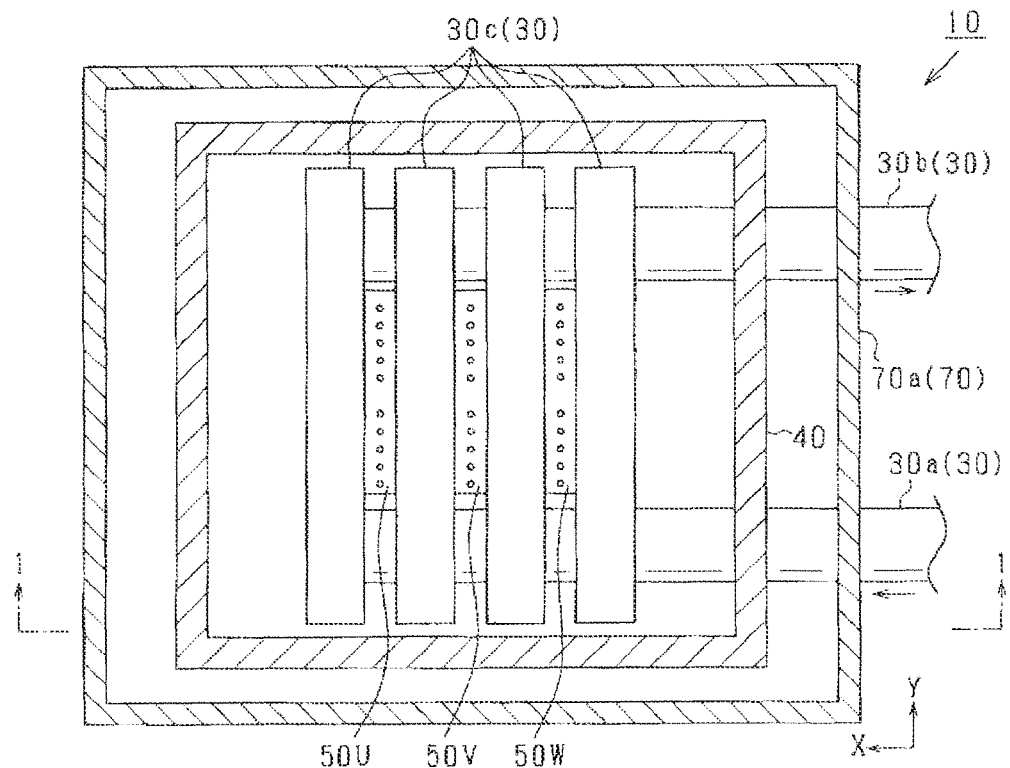
FIG. 2 is a cross sectional view taken along a line 2-2 of FIG. 1.
Figure 3:
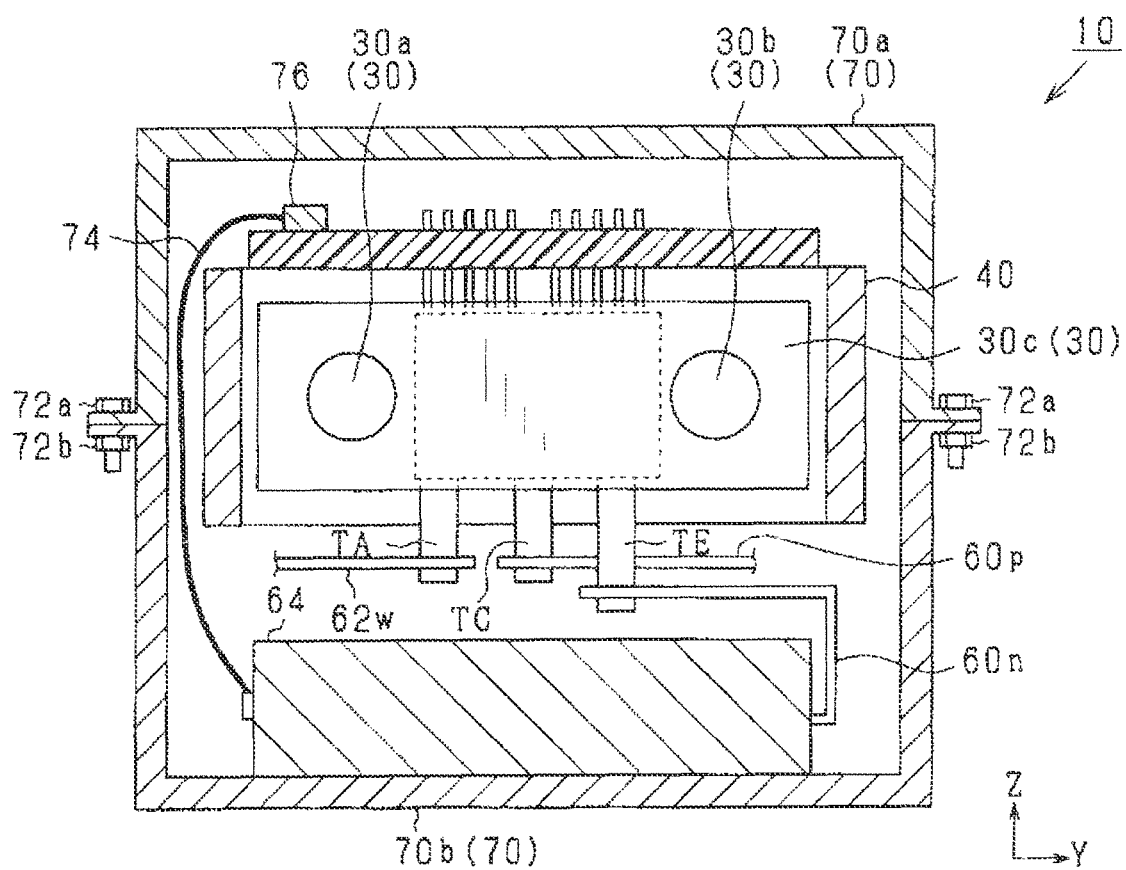
FIG. 3 is a cross sectional view taken along a line 3-3 of FIG. 1.

Referring first to FIGS. 1 to 3, a general configuration of a three-phase inverter 10 of the present embodiment is described.

FIGS. 1 to 3 are cross-sectional views illustrating the three-phase inverter 10. As shown in these figures, the three-phase inverter 10 includes: a single circuit board 20; cooler 30; frame 40; U-, V- and W-phase semiconductor modules 50U, 50V and 50W; positive-side bus bar 60p as the "positive-side electrically conductive member"; negative-side bus bar 60n as the "negative-side electrically conductive member"; U-, V- and W-phase alternating-current bus bars 62U, 62V and 62W; smoothing capacitor 64; and a housing (casing 70) that houses these components.

The casing 70 includes a cover 70a and a casing body 70b. The casing 70 is formed of a material (e.g., metal or electrically conductive resin) that shields switching noise (electromagnetic waves). The switching noise is generated when switching elements incorporated in the U-, V- and W-phase semiconductor modules 50U, 50V and 50W are turned on/off. The casing body 70b is a box-like member with one face being open. The opening of the casing body 70b is closed by the cover 70a which is fixed to the casing body 70b by means of fixing means. The fixing means in the present embodiment are bolts 72a and nuts 72b.

The frame 40 is housed in and fixed to the casing body 70b by means of fixing means (e.g., bolts), not shown. On top of the frame 40, the circuit board 20 is fixed.

The frame 70 houses the U-, V- and W-phase semiconductor modules 50U, 50V and 50W. Similar to the casing 70, the frame 40 is formed of a material (e.g., metal or electrically conductive resin) that shields switching noise.

Inside the casing 70, the smoothing capacitor 64 is arranged beneath the frame 40 to smooth direct-current voltage applied to the U-, V- and W-phase semiconductor modules 50U, 50V and 50W.

The circuit board 20, in a plan view of the surface thereof, is in a rectangular shape. The circuit board 20 has a function of turning on/off the switching elements incorporated in the U-, V- and W-phase semiconductor modules 50U, 50V and 50W. This function is realized by an electronic component, such as an integrated circuit or a one-chip microcomputer, mounted on the circuit board 20. The details of the circuit board 20 will be described later.

The smoothing capacitor 64 has a positive terminal which is connected to a second connecting portion of a discharge resistor, described later, via a wire 74 as the "electrically conductive connection member" and a connector 76 provided on the circuit board 20.

The cooler 30 includes an inlet pipe 30a that charges a cooling fluid into the three-phase inverter 10, an outlet pipe 30b that externally discharges the cooling fluid from the three-phase inverter 10, and a plurality of cooling members 30c. Each of the plurality of cooling members 30c establishes a connection between the inlet pipe 30a and the outlet pipe 30b. The plurality of cooling members 30c are alternately stacked with the U-, V- and W-phase semiconductor modules 50U, 50V and 50W. Accordingly, each semiconductor module is sandwiched between a pair of cooling members 30c adjacent to the semiconductor module. When the cooling fluid is charged into the inlet pipe 30a of the cooler 30 configured as mentioned above, the cooling fluid flows through the plurality of cooling members 30c. The cooling fluid that has flowed through the plurality of cooling members 30c is discharged from the outlet pipe 30b. Thus, the U-, V- and W-phase semiconductor modules 50U, 50V and 50W are cooled. It should be appreciated that the cooler 30 is fixed to the frame 40.

Figure 4:
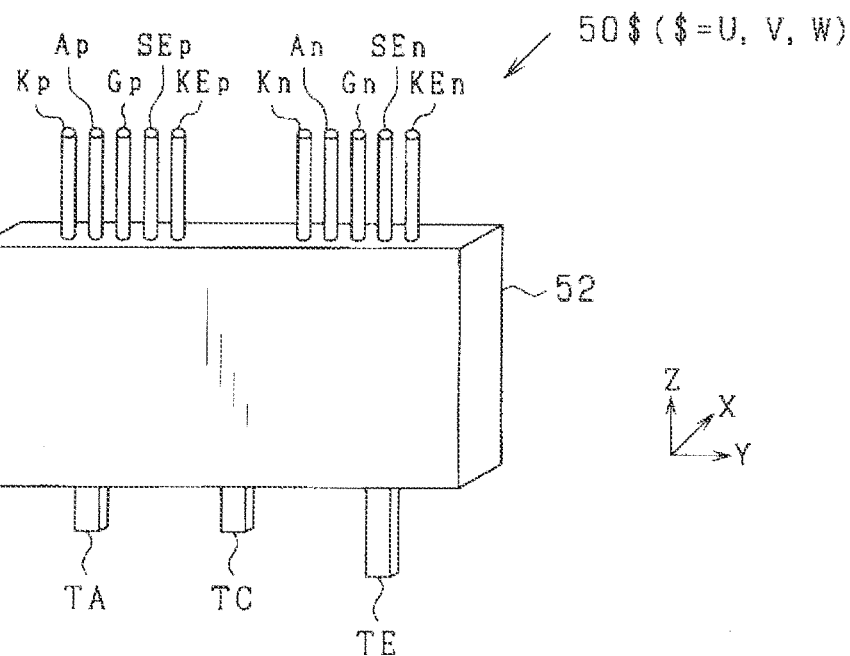
FIG. 4 is a perspective view illustrating a configuration of a semiconductor module, according to the embodiment.
Figure 5:
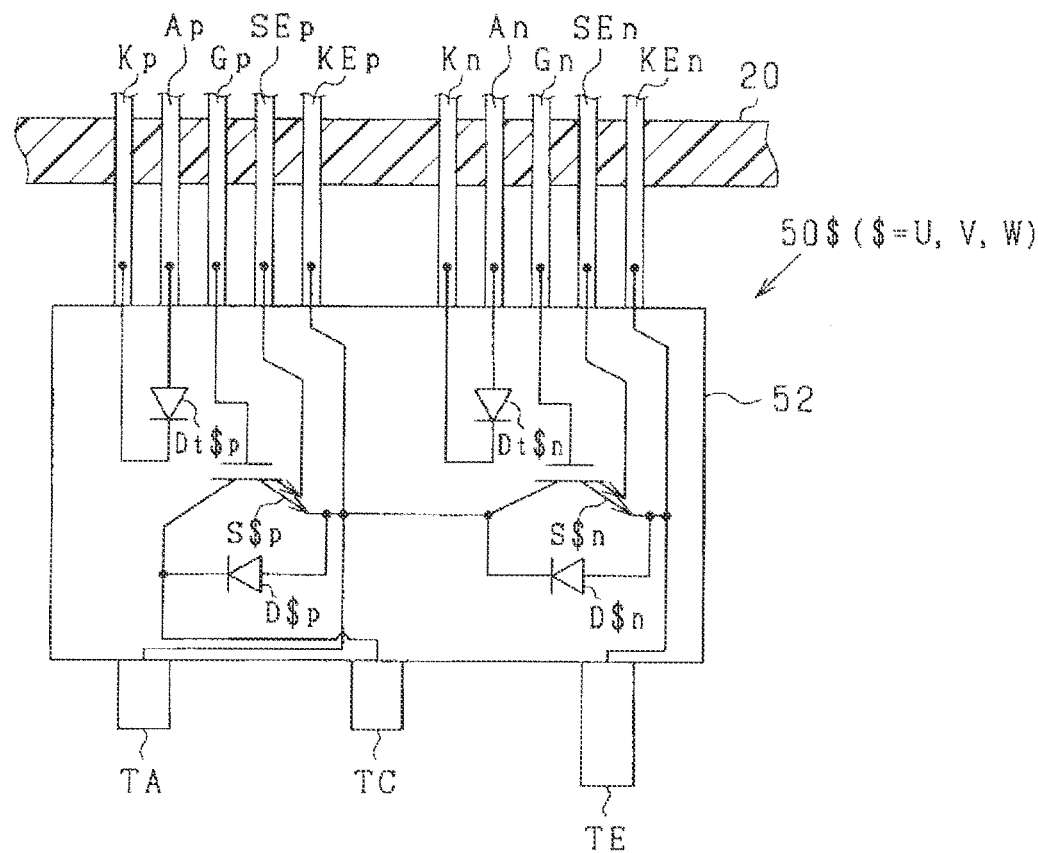
FIG. 5 is a circuit diagram illustrating an internal configuration of the semiconductor module.

Each of the U-, V- and W-phase semiconductor modules 50U, 50V and 50W is formed by modularizing switching elements and freewheel diodes that are in inverse-parallel connection with the respective switching elements. Referring now to FIGS. 4 and 5, a configuration of each $-phase semiconductor module 50$ ($=U, V and W) is described.

The $-phase semiconductor module 50$ is a module including: a $-phase upper arm switching element S$p; a $-phase upper arm freewheel diode D$p which is in inverse-parallel connection with the $-phase upper arm switching element S$p; a $-phase lower arm switching element S$n; a $-phase lower arm freewheel diode D$n which is in inverse-parallel connection with the $-phase lower arm switching element S$n; a $-phase upper arm thermostatic diode Dt$p which detects the temperature of the $-phase upper arm switching element S$p; and a $-phase lower arm thermostatic diode Dt$n which detects the temperature of the $-phase lower arm switching element S$n. The $-phase semiconductor module 50$ includes a body 52, a plurality of control terminals projected from the body 52 and a plurality of power terminals projected from the body 52. The body 52 incorporates therein the members S$p, D$p, S$n, D$n, Dt$p and Dt$n. In the present embodiment, an IGBT (insulated gate bipolar transistor) is used as the switching element S$# (#=p or n).

The plurality of control terminals include a Kelvin emitter terminal KE#, sense terminal SE#, gate G# of the switching element S$#, anode A# and cathode K# of the thermostatic diode Dt$#. The Kelvin emitter terminal KE# has a potential equal to that of the output terminal (emitter) of the switching element S$#. The sense terminal SE# outputs a very small electric current correlated to the current passing across the input terminal (collector) and the emitter of the switching element S$#.

The plurality of power terminals are a collector terminal TC that is short-circuited to the collector of the $-phase upper arm switching element S$p, an emitter terminal TE that is short-circuited to the emitter of the $-phase lower arm switching element S$n, and an alternating-current terminal TA.

The body 52 is in a flat rectangular parallelopiped shape. The body 52 has a pair of surfaces that are opposed to each other, one of which is provided with the plurality of control terminals vertically projected from the surface. The other of the pair of surfaces is provided with the power terminals vertically projected from the surface.

Referring to FIGS. 1 to 3 again, the U-, V- and W-phase semiconductor modules 50U, 50V and 50W are mounted on the circuit board 20 via the control terminals. Specifically, the U-, V- and W-phase semiconductor modules 50U, 50V and 50W are soldered to the circuit board 20. These semiconductor modules are mounted being juxtaposed in a row in the positive direction of the X axis in order of 50W, 50V and 50U, in a plan view of the surface of the circuit board 20 on the casing 70 side.

Figure 6:
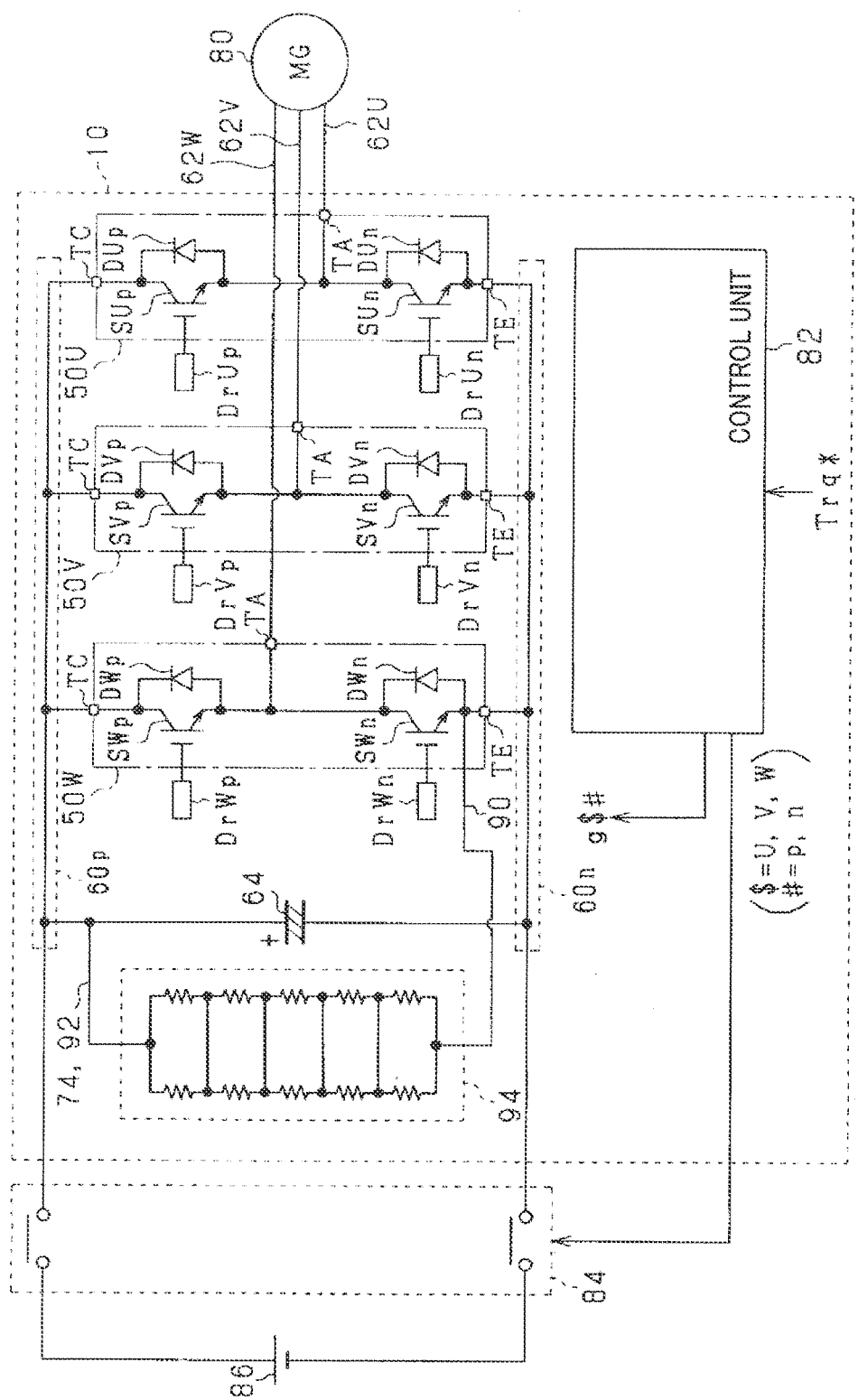
FIG. 6 is a schematic diagram illustrating a general configuration of a motor control system, according to the embodiment.

Referring now to FIG. 6, hereinafter is described a general configuration of a motor control system related to the present embodiment.

FIG. 6 is a schematic diagram illustrating a general configuration of the motor control system. As shown in FIG. 6, the motor control system includes a three-phase inverter 10, a motor-generator 80 and a control unit 82. The motor-generator 80 is connected to drive wheels, not shown, and plays a role of an in-vehicle main machine or the like. In the present embodiment, the motor-generator 80 is a permanent magnet synchronous motor (e.g., IPMSM (interior permanent magnet synchronous motor) or SPMSM (surface permanent magnet synchronous motor)).

The three-phase inverter 10 is connected to a high-voltage battery 86 (e.g., lithium-ion secondary battery or nickel hydride secondary battery) as the "direct-current power source" via a main relay 84. The main relay 84 has a function of performing power on/off operation to electrically disconnect or electrically connect between the high-voltage battery 86 and the three-phase inverter 10. The three-phase inverter 10, the motor-generator 80 and the high-voltage battery 86 configure an in-vehicle high-voltage system. The three-phase inverter 10 is configured to convert the direct-current voltage of the high-voltage battery 86 to an alternating-current voltage.

The collector terminals TC connected to the respective U-, V- and W-phase upper arm switching elements SUp, SVp and SWp are connected to each other via a positive-side bus bar 60p. The positive-side bus bar 60p is connected to the positive terminal of the smoothing capacitor 64, while being connected to the positive terminal of the high-voltage battery 86 via the main relay 84. On the other hand, the emitter terminals TE connected to the respective U-, V- and W-phase lower arm switching elements SUn, SVn and SWn are connected to each other via a negative-side bus bar 60n. The negative-side bus bar 60n is connected to the negative terminal of the smoothing capacitor 64, while being connected to the negative terminal of the high-voltage battery 86 via the main relay 84. The positive-side and negative-side bus bars 60p and 60n may each be formed of a single electrically conductive member or may be formed of two or more integrated electrically conductive members.

The $-phase upper arm switching element S$p is connected to the $-phase lower arm switching element S$n via a connecting point. The connecting point is connected to the phase $ of the motor-generator 80 via the alternating-current terminal TA and a $-phase alternating-current bus bar 62$.

The control unit 82 is mainly configured by a microcomputer that includes CPU, ROM and RAM. The control unit 82 configures an in-vehicle low-voltage system. The control unit 82 turns on/off the switching element S$# to control the controlled variable (torque) of the motor-generator 80 to a command value of the controlled variable (hereinafter, this command value is referred to as torque command Trq*). Specifically, the control over the motor-generator 80 corresponds to the control for turning on/off the switching element S$# so that a command current for realizing the torque command Trq* coincides with the current passing through the motor-generator 80. More specifically, in the present embodiment, the output torque of the motor-generator 80 is a final controlled variable. Accordingly, in order to control the output torque, the current passing through the motor-generator 80 is used as an immediate controlled variable and is controlled to a command current. In particular, in the present embodiment, current vector control is applied to the current passing through the motor-generator 80 to control the current to a command current.

With the current vector control, the control unit 82 generates a drive signal g$# to turn the output voltage of the three phases of the three-phase inverter 10 to a voltage that simulates a command voltage. The drive signal g$# generated by the control unit 82 is outputted to a drive circuit Dr$# provided on the surface of the circuit board 20. The drive circuit Dr$# serves as a gate drive circuit for charging/discharging the gate of the switching element S$# in accordance with the drive signal g$#. The switching element S$# is turned on/off by the drive circuit Dr$#. Thus, the motor-generator 80 is supplied with sine-wave current in which the phases are offset from each other by 120°.

Figure 7:
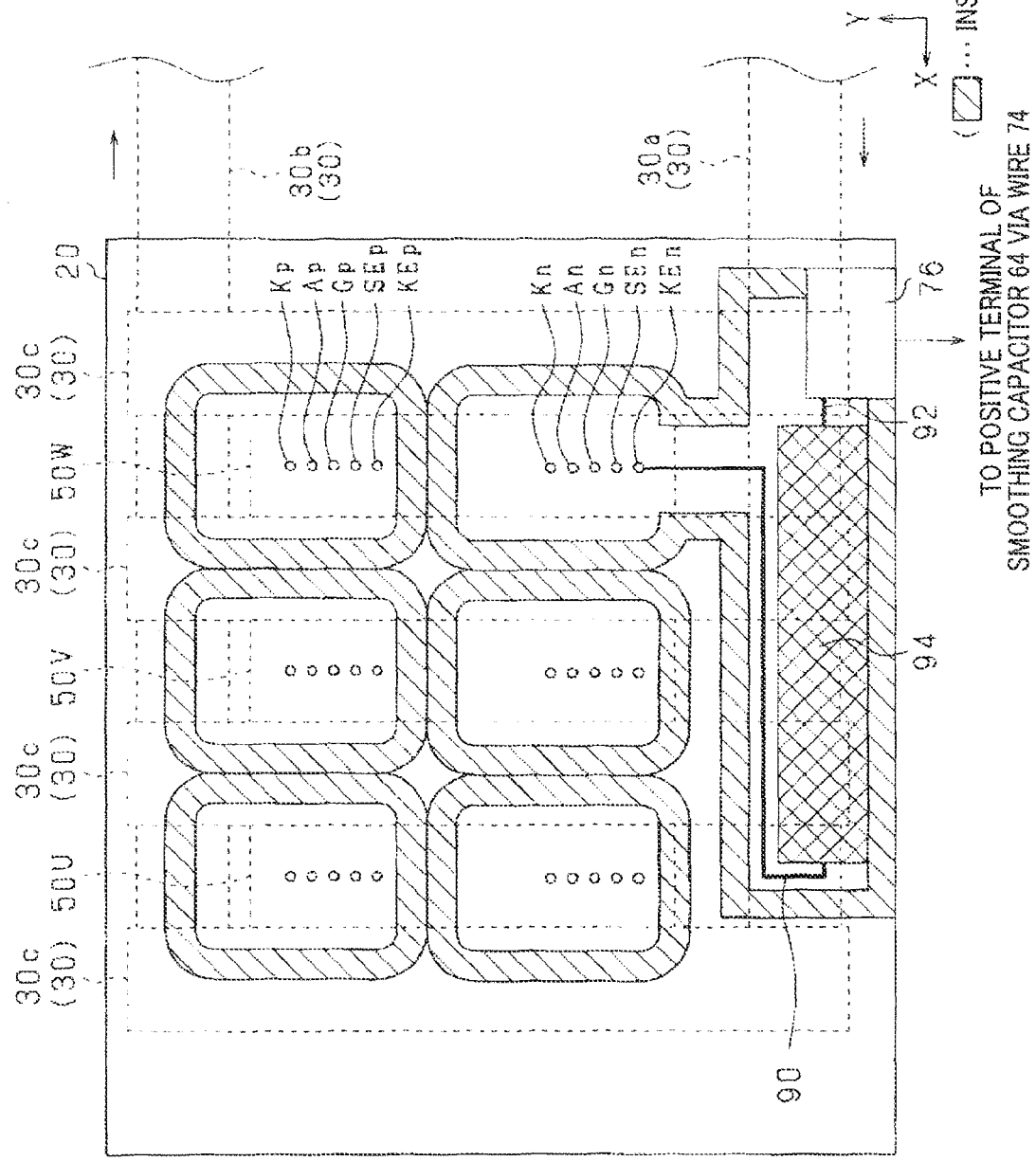
FIG. 7 is a plan view illustrating a circuit board as viewed from a casing side, according to the embodiment.

Further, the control unit 82 performs discharge control. With the discharge control, the control unit 82 switches the state of the main relay 84 to a turned-off state to stop the operation of the three-phase inverter 10 and then allows discharge of the electric charges accumulated in the smoothing capacitor 64. Referring now to FIG. 7, a technique for arranging a discharge resistor on the circuit board 20 is described. The discharge resistor is associated with the discharge control.

FIG. 7 is a plan view illustrating a surface of the circuit board 20 as viewed from the casing 70 side. The illustration of FIG. 7 includes insulating regions that electrically insulate adjacent regions from each other.

As shown in FIG. 7, the surface of the circuit board 20 is provided with a first wiring pattern 90, discharge resistor 94, second wiring pattern 92 and connector 76. Of the switching elements S$#, the W-phase lower arm switching element SWn is located on an extreme upstream side of the cooling fluid in the three-phase inverter 10. The Kelvin emitter terminal KEn of the W-phase lower arm switching element SWn is connected to an end (first connecting portion) of the discharge resistor 94 via the first wiring pattern 90. The other end (second connecting portion) of the discharge resistor 94 is connected to the connector 76 via the second wiring pattern 92. In the present embodiment, the Kelvin emitter terminal KEn corresponds to the detection terminal i.e., "terminal that is short-circuited to one of the ends of a series-connected element including the upper-arm switching element and the lower-arm switching element, the one of the ends being an end to which the second connecting portion T2 is not connected".

Figure 8:
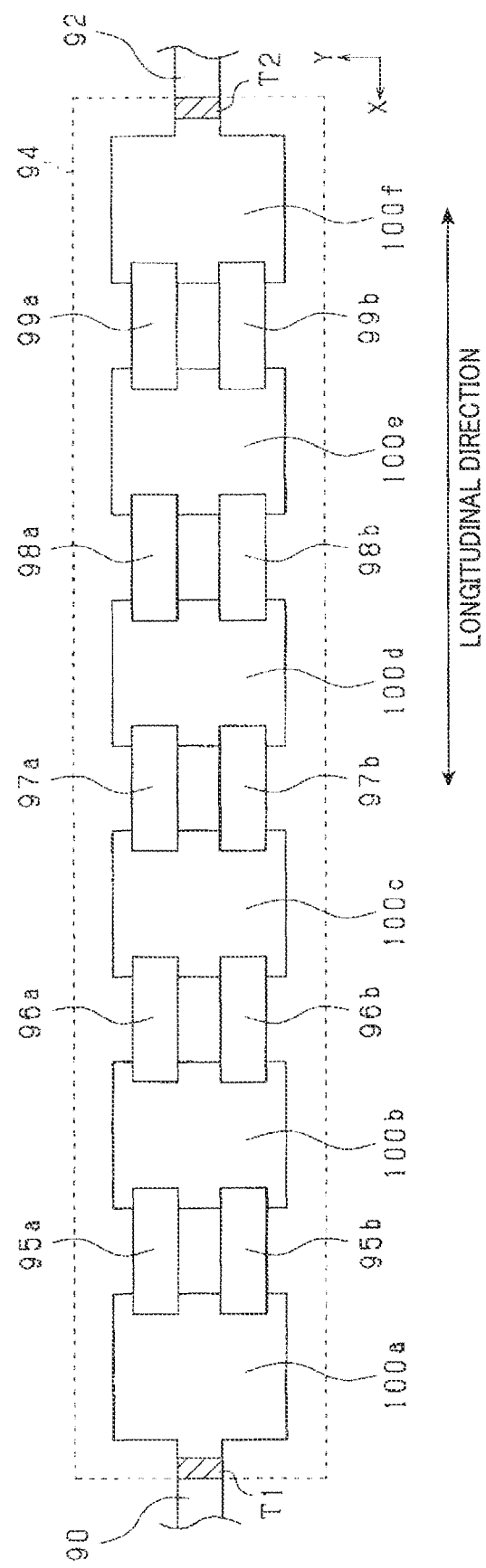
FIG. 8 is a diagram illustrating in detail a discharge resistor, according to the embodiment.

FIG. 8 illustrates the details of the discharge resistor 94.

As shown in FIG. 8, the discharge resistor 94 includes first to tenth resistor elements 95a to 99a and 95b to 99b (specifically, surface mounted (SMD) resistor elements) and first to sixth resistance patterns 100a to 100f. Specifically, the first and second resistor elements 95a and 95b are connected parallel to each other by the first and second resistance patterns 100a and 100b. The third and fourth resistor elements 96a and 96b are connected parallel to each other by the second and third resistance patterns 100b and 100c. Further, the fifth and sixth resistor elements 97a and 97b are connected parallel to each other by the third and fourth resistance patterns 100c and 100d. The seventh and eighth resistor elements 98a and 98b are connected parallel to each other by the fourth and fifth resistance patterns 100d and 100e. The ninth and tenth resistor elements 99a and 99b are connected parallel to each other by the fifth and sixth resistance patterns 100e and 100f. These parallel connections are connected in series to form series-connected unit. The first to sixth resistance patterns 100a to 100f are, in other words, wiring patterns that connect the adjacent parallel connections among the plurality of parallel connections of the resistor elements.

The discharge resistor 94 is employed from the viewpoint of its heat radiation performance and its fail-safe performance in the occurrence of an open failure. In the present embodiment, the ends of the discharge resistor 94 (portions of the resistance patterns 100a and 100f, i.e., both ends of the discharge resistor in the longitudinal direction (X-direction) as shown in FIG. 8) are referred to as a first connecting portion T1 and a second connecting portion T2, respectively, for the sake of convenience.

The second connecting portion T2 is connected to the positive terminal of the smoothing capacitor 64 via the second wiring pattern 92, the connector 76 and a wire 74 that is connected to the connector 76. On the other hand, the connecting portion T1 is connected to the negative terminal of the smoothing capacitor 64 via the first wiring pattern 90 and the Kelvin emitter terminal KEn.

Of the pair of surfaces of the circuit board 20, the surface opposite to the surface provided with the discharge resistor 94 may be provided with a heat radiation pattern. In this case, for example, at least one of the first to sixth resistance patterns 100a to 100f may only have to be connected to the heat radiation pattern through via holes.

Referring to FIG. 7 again, the three-phase inverter 10 of the present embodiment is configured so that, in a plan view of the surface of the circuit board 20, a part of the discharge resistor 94 and a part of the first wiring pattern 90 are ensured to overlap the inlet pipe 30a that configures the cooler 30. Further, the three-phase inverter 10 of the present embodiment is configured so that, in a plan view of the surface of the circuit board 20, a part of the discharge resistor 94 overlaps a part of each of the plurality of cooling members 30c on the inlet tube 30a side (in FIG. 7, the part being near the inlet tube 30a with reference to the center of the cooling member 30c with respect to the direction Y).

According to the embodiment described so far, advantageous effects as provided below are obtained.

(1) The first connecting portion T1 of the discharge resistor 94 is connected to the Kelvin emitter terminal KEn via the first wiring pattern 90 provided on the surface of the circuit board 20. The Kelvin emitter terminal KEn is a component of the W-phase semiconductor module that is cooled by the cooler 30. Therefore, the temperature of the Kelvin emitter terminal KEn is much lower than the temperature of the discharge resistor 94. Thus, according to the present embodiment, a greater part of the heat generated by the discharge resistor 94 can be directed toward the Kelvin emitter terminal KEn via the first wiring pattern 90. In this way, the discharge resistor 94 is appropriately cooled and, further, the reliability of the three-phase inverter 10 is favorably prevented from being impaired.

(2) The discharge resistor 94 has the configuration shown in FIG. 8. The three-phase inverter 10 is configured so that, in a plan view of the surface of the circuit board 20, a part of the discharge resistor 94 and a part of the first wiring pattern 90 overlap the cooler 30. The discharge resistor 94 includes the resistor elements 95a to 99a and the resistor elements 95b to 99b. The resistor elements 95a to 99a are connected parallel to the respective resistor elements 95b to 99b. Accordingly, the area occupied by the discharge resistor 94 on the surface of the circuit board 20 is large in respect of the direction in which the parallelly connected resistor elements are juxtaposed (direction Y). The large area can contribute to increasing the area in which the discharge resistor 94 overlaps the cooler 30, in a plan view of the surface of the circuit board 20. Thus, the effect of cooling the discharge resistor 94 can be more enhanced.

(3) The three-phase inverter 10 is configured so that, in a plan view of the surface of the circuit board 20, a part of the discharge resistor 94 and a part of the first wiring pattern 90 overlap the inlet pipe 30a that configures the cooler 30. The cooling fluid is charged into the cooling members 30c through the inlet pipe 30a. After exchanging heat with the semiconductor modules and increasing temperature, the cooling fluid is discharged outside the cooler 30 through the outlet pipe 30b. Accordingly, the temperature of the cooling fluid is lower in the inlet pipe 30a than in the outlet pipe 30b. In the present embodiment, the discharge resistor 94 and the first wiring pattern 90 are located closer to the inlet pipe 30a in which the temperature of the cooling fluid is lower than in the outlet pipe 30b. Thus, the effect of cooling the discharge resistor 94 can be more enhanced.

(4) The three-phase inverter 10 is configured so that, in a plan view of the surface of the circuit board 20, a part of the discharge resistor 94 overlaps a part of each of the plurality of cooling members 30c on the inlet tube 30a side. The temperature of the cooling fluid on the outlet pipe 30a side in the cooling members 30c is lower than the temperature of the cooling fluid on the outlet pipe 30b side. Thus, according to the present embodiment, the effect of cooling the discharge resistor 94 can be more enhanced.

(5) The connecting portion T1 of the discharge resistor 94 is connected to the negative terminal of the smoothing capacitor 64 via the first wiring pattern 90 and the Kelvin emitter terminal KEn. On the other hand, the second connecting portion T2 of the discharge resistor 94 is connected to the positive terminal of the smoothing capacitor 64 via the second wiring pattern 92, the connector 76 and the wire 74. Thus, an insulating distance is no longer required to be secured in the connector 76 and hence the size of the connector 76 is favorably prevented from becoming large.

(6) The first connecting portion T1 is connected only to the Kelvin emitter terminal KEn of the W-phase lower arm switching element SWn, among the Kelvin emitter terminals of the U-, V- and W-phase lower arm switching elements Sun, SVn and SWn. If the Kelvin emitter terminals of the U-, V- and W-phase lower arm switching elements Sun, SVn and SWn are configured to be individually connected to the first connecting portion T1 via the first wiring pattern 90, the heat radiation performance of the discharge resistor 94 would be enhanced but the following disadvantages could be brought about. Specifically, use of the above configuration leads to creation of closed circuits (current loops) in the respective U, V and W phases. The closed circuits are each formed of the first wiring pattern 90, the Kelvin emitter terminal of the U-, V- or W-phase lower arm switching element and the negative-side bus bar 60n. In this case, when magnetic flux passes through the closed circuits, current will pass through the closed circuits. Such circulation of the current through the closed circuits could have a disadvantage of generating noise. In this regard, according to the present embodiment, closed circuits are not formed by the first wiring pattern 90, the Kelvin emitter terminals and the negative-side bus bar 60n. In this way, the disadvantage of noise generation could not happen.

Other Embodiments

The foregoing embodiment may be modified and implemented as follows.

In the foregoing embodiment, the three-phase inverter 10 is configured so that, in a plan view of the surface of the circuit board 20, a part of the discharge resistor 49 and a part of the first wiring pattern 90 overlap the cooler 30. However, this shall not impose a limitation. For example, the three-phase inverter 10 may be configured so that, in a plan view of the surface of the circuit board 20, the entire discharge resistor 94 and the entire first wiring pattern 90 overlap the cooler 30. Alternatively, for example, in a plan view of the surface of the circuit board 20, an object overlapped with the cooler 30 may be only the discharge resistor 94.

The detection terminal, i.e., "terminal that is short-circuited to one of the ends of a series-connected element including the upper-arm switching element and the lower-arm switching element, the one of the ends being an end to which the second connecting portion T2 is not connected" is not limited to the Kelvin emitter terminal KEn of the lower arm switching element S$n. For example, if a semiconductor module includes in the control terminals a terminal which is short-circuited to the collector of an upper arm switching element S$p (hereinafter referred to as collector control terminal), the terminal in question may be the collector control terminal. In this case, the second connecting portion T2 may be connected to the negative terminal of the smoothing capacitor 64 via the connector and the wire that is connected to the connector, while the first connecting portion T1 may be connected to the positive terminal of the smoothing capacitor 64 via the first wiring pattern provided on the surface of the circuit board 20 and the collector control terminal.

The "discharge resistor" is not limited to the one shown in FIG. 8 but may, for example, be the one shown in FIG. 2 of the patent document JP-A-2012-039715. Further, the number of the parallel connections of the resistor elements configuring the "discharge resistor" may be three or more.

The "electrically conductive connection member" is not limited to the wire 74 but may be a different electrically conductive member.

The "semiconductor module" is not limited to the member in which both of an upper arm switching element and a lower arm switching element are modularized. For example, the "semiconductor module" may be formed of members in which an upper arm switching element and a lower arm switching element are separately modularized.

The "direct-current power source" is not limited to a battery. For example, the "direct-current power source" may be configured by an alternating-current power source and a full-wave rectifier circuit that converts the alternating-current voltage outputted from the alternating-current power source into a direct-current voltage.

The "rotary machine" (i.e., motor-generator 80) is not limited to a permanent magnet synchronous motor but may be a different synchronous machine. Alternative to a synchronous motor, the "rotary machine" may be an induction machine or the like.

The "switching element" is not limited to an IGBT but may be a MOSFET or the like.

The "inverter" is not limited to a three-phase inverter but may be a half-bridge inverter, a full-bridge inverter or the like. Further, the "power converter" is not limited to an inverter but may be a different power converter, such as a DC-DC converter.

What is claimed is:

1. A power converter that converts a direct-current voltage received by the power converter to an alternating-current voltage, comprising:
    a body including a switching element;
    a plurality of semiconductor modules each having a control terminal projected from the body;
    a circuit board that controls the switching element to be ON and OFF;
    a cooler that cools the semiconductor modules;
    a smoothing capacitor that smooth direct-current voltage applied to the switching element;
    a discharge resistor disposed on a surface of the circuit board and electrically connected parallel to the smoothing capacitor,
wherein
    the semiconductor modules are mounted on the circuit board with the control terminal;
    the discharge resistor includes a first connecting portion at one end of the discharge resistor in a longitudinal direction thereof and a second connecting portion at an other end of the discharge resistor in the longitudinal direction thereof;
    the first connecting portion is connected to the control terminal via a wiring pattern provided on the surface of the circuit board;
    the discharge resistor is provided with a series-connected unit in which a plurality of parallel-connected resister elements are connected in series; and
    the power converter is configured such that at least a part of the discharge resistor overlaps the cooler when viewing from the surface of the circuit board;
    the switching element is provided with a series-connected element including an upper arm switching element and a lower arm switching element;
    the circuit board controls the upper arm switching element and the lower arm switching element to be ON and OFF so as to convert the direct-current voltage to the alternating-current voltage;
    the smoothing capacitor is connected in parallel to the series-connected element;
    the second connecting portion is connected to one end of the smoothing capacitor via a connector provided on the circuit board and an electrically conductive connection member;
    the control terminal includes a detection terminal that is short-circuited to one of both ends of the series-connected element, the one of the both ends of the series-connected element being an end to which the second connecting portion is not connected; and the first connecting portion is connected to one of both ends of the smoothing capacitor via the wiring pattern and the detection terminal, the one of the both ends of the smoothing capacitor being an end to which the second connecting portion is not connected.

2. The power converter according to claim 1, wherein the cooler includes:
- an inlet pipe that charges a cooling fluid for cooling the semiconductor modules;
- an outlet pipe that externally discharges the cooling fluid; and
- a plurality of cooling members that connects between the inlet pipe and the outlet pipe and allows the cooling fluid to flow from the inlet pipe to the outlet pipe, each of the plurality of cooling members are alternately stacked with each of the plurality of semiconductor modules, and the power converter is configured such that at least a part of the discharge resistor overlaps the inlet pipe when viewing from the surface of the circuit board.

3. The power converter according to claim 1, wherein the power converter is configured such that at least a part of the discharge resistor overlaps a part of an inlet pipe side among the plurality of cooling members when viewing from the surface of circuit board.

4. The power converter according to claim 1, wherein the switching element is provided with a plurality of the series-connected element;

the first connecting portion is connected to one of both ends of the smoothing capacitor via the wiring pattern and one detection terminal among a plurality of detection terminals, the one of the both ends of the smoothing capacitor being an end to which the second connecting portion is not connected.

5. The power converter according to claim 4, wherein the cooler includes:
- an inlet pipe that charges a cooling fluid for cooling the semiconductor modules;
- an outlet pipe that externally discharges the cooling fluid; and
- a plurality of cooling members that connects between the inlet pipe and the outlet pipe and allows the cooling fluid to flow from the inlet pipe to the outlet pipe, each of the plurality of cooling members are alternately stacked with each of the plurality of semiconductor modules, and the power converter is configured such that at least a part of the discharge resistor overlaps the inlet pipe when viewing from the surface of the circuit board.

* * * * *